United States Patent
Olin et al.

(10) Patent No.: US 7,363,802 B2
(45) Date of Patent: Apr. 29, 2008

(54) MEASUREMENT DEVICE FOR ELECTRON MICROSCOPE

(75) Inventors: Håkan Olin, Göteborg (SE); Krister Svensson, Göteborg (SE); Fredrik Althoff, Mölnlycke (SE); Andrey Danilov, Göteborg (SE)

(73) Assignee: Nanofactory Instruments AB, Göteborg (SE)

( * ) Notice: Subject to any disclaimer, the term of this patent is extended or adjusted under 35 U.S.C. 154(b) by 0 days.

(21) Appl. No.: 10/843,662

(22) Filed: May 12, 2004

(65) Prior Publication Data

US 2005/0103996 A1    May 19, 2005

(51) Int. Cl.
*B23Q 17/09* (2006.01)

(52) U.S. Cl. ........................................ 73/104
(58) Field of Classification Search ............ 73/105, 73/104; 250/234, 306, 307
See application file for complete search history.

(56) References Cited

U.S. PATENT DOCUMENTS

| | | | |
|---|---|---|---|
| 4,698,502 A * | 10/1987 | Bednorz et al. | 250/306 |
| 5,025,658 A * | 6/1991 | Elings et al. | 73/105 |
| 5,354,985 A * | 10/1994 | Quate | 250/234 |
| 5,466,935 A * | 11/1995 | Ray et al. | 250/307 |
| 5,515,719 A | 5/1996 | Lindsay | |
| 5,612,491 A * | 3/1997 | Lindsay | 73/105 |
| 5,763,767 A * | 6/1998 | Jung et al. | 73/105 |
| 5,992,226 A | 11/1999 | Green | |
| 6,196,061 B1 | 3/2001 | Adderton et al. | |
| 6,405,584 B1 * | 6/2002 | Bindell et al. | 73/105 |
| 6,476,386 B1 * | 11/2002 | Kirschner et al. | 250/302 |
| 6,715,346 B2 * | 4/2004 | Shuman | 73/105 |
| 6,745,618 B2 * | 6/2004 | Imai et al. | 73/105 |
| 6,818,891 B1 * | 11/2004 | Hough et al. | 250/306 |
| 6,841,788 B1 * | 1/2005 | Robinson et al. | 250/492.3 |
| 6,862,924 B2 * | 3/2005 | Xi et al. | 73/105 |
| 6,864,483 B2 * | 3/2005 | Olin | 250/311 |
| 2004/0168527 A1 * | 9/2004 | Nakayama et al. | 73/864.41 |

FOREIGN PATENT DOCUMENTS

WO    WO 0163204    8/2001

* cited by examiner

*Primary Examiner*—Max Noori
(74) *Attorney, Agent, or Firm*—Harness, Dickey & Pierce, P.L.C.

(57) ABSTRACT

This invention relates to a measurement device for use in an electron microscope. The device comprises a sample holder, for holding a sample to be studied, and an indentation tip, being arranged in proximity of the sample holder, whereby an interaction between the sample and the tip is arranged to be measured. The measurement device comprises a force sensor being positioned in proximity with an interaction area of the sample and the tip and is arranged to directly measure a force resulting from interaction between the sample and the tip.

17 Claims, 4 Drawing Sheets

MEASUREMENT DEVICE FOR ELECTRON MICROSCOPE

TECHNICAL FILED OF THE INVENTION

This invention relates to a measurement device for use in an electron microscope, such as a transmission electron microscope or a scanning electron microscope, the device comprising a sample holder, for holding a sample to be studied, and an indenter tip, being arranged in proximity of said sample holder, whereby an interaction between said sample and said tip is arranged to be measured.

BACKGROUND OF THE INVENTION

As the nanotechnology field is developed, the demands on measuring capabilities is increased, and the wish to be able to perform measurements with atomic resolution has increased dramatically over the past years. In this field, electron microscopes are commonly used instead of common light microscopes, since electrons has a smaller wavelength than light, and hence can resolve much smaller structures. Different types of electron microscopes, such as transmission electron microscopes (TEM) and also scanning electron microscopes (SEM), partly solves the above-mentioned problems and demands. Moreover, different scanning probe technologies, such as scanning probe microscopy (SPM), scanning tunnelling microscopy (STM) and atomic force microscopy (AFM) have been developed, and these also solve some of the above problems.

Force interactions between nano-particles has been studied for a long time. One technique for this is Transmission Electron Microscopy (TEM), in which direct visualisation of the interacting particles gives understanding of the interaction. However, this method only gives a visual presentation of the interaction, and its use is therefore limited. One improved method and device for studying force interactions between nano-particles is the TEM-STM microscope (transmission electron microscope-scanning tunnelling microscope). In this kind of microscope a scanning tunnelling microscope (STM) is placed inside a transmission electron microscope (TEM), enabling simultaneous measurements of sample structure as well as electrical properties of the samples, such as conductance. This microscopy technique is much helpful when studying certain aspects of particle interaction. However, there is still a need for extending the range of experiments that can be performed, and thereby gaining a deeper understanding of the nature of matter.

One such improved measurement method is disclosed in the patent document WO 01/63204. This document discloses a transmission electron microscopy device, being combined with an atomic force microscopy device, positioned within the transmission electron microscope. This device enables atomic force microscopy (AFM) measurements to be made in a TEM environment, thereby enabling simultaneous TEM and AFM measurements, for investigating the relationship between the interaction force between and the geometry of interacting particles.

Recently, considerable amount of research has been directed towards the measurement of mechanical properties, such as hardness, delamination, tribology and so on. For this reason, so called nanoindentation measurement devices has been developed. In a nanoindentation device, a sample to be studied is positioned in a sample holder, and an indenter tip is arranged to be pressed onto the surface of the sample. An example of such a nanoindentation device is disclosed in the article "Quantitative in situ nanoindentation in an electron microscope", Minor et al, Applied Physics letters, Vol 79, no 11, 10 Sept 2001, pp 1625-1627. This device comprises a sample holder holding a sample, and a diamond indenter. The indenter is mounted on a piezoceramic actuator, which both controls its position and forces it to the edge of the sample. The characteristics of the piezoceramic actuator is also used to indirectly calculate the force of the nanoindentation, by measuring the displacement of the indenter and the voltage applied to the piezoceramic actuator. However, the actuator characteristics must be calibrated carefully in order to be able to calculate a correct value of the force, and hence a more straight-forward measurement device for force measurements in for use in for example nanoindentation measurements is desired.

SUMMARY OF THE INVENTION

The above and other objects of the invention are achieved by a measurement device as defined by claim 1. According to this claim the above object is achieved by a measurement device as defined by way of introduction, further characterised in that the measurement device further comprises a force sensor, being positioned in proximity with an interaction area of said sample and said tip, and being arranged to directly measure a force resulting from interaction between said sample and said tip. By utilising a force sensor within the transmission electron microscope, direct force measurements may be realised, further improving the quality and simplicity of in-situ measurements. The force sensor may be positioned in contact with, or in close proximity with said sample. Alternatively the force sensor is positioned in contact with, or in close proximity with said indentation tip.

Preferably, said force sensor comprises a flexible structure, such as a cantilever or a membrane, having a determined force constant, the force sensor further comprising a force measurement element, connected with said flexible structure, for measuring the force applied on said flexible structure. Moreover, one of said indentation tip and said sample is suitably arranged on said flexible structure, thereby providing a direct connection between the force application area and the measurement area.

According to a preferred embodiment of this invention, the force measurement element is realised by means of a capacitive sensing element. Suitably, said capacitive sensing element comprises a first electrode, being arranged on said flexible structure, and a second electrode, being arranged at a distance from said first electrode, said electrodes together forming a capacitive element, being a straight-forward approach.

According to a second preferred embodiment of the invention, the force measurement element is realised by means of a piezoresistive sensing element, being either arranged on or integrated with said flexible structure.

According to a third preferred embodiment of the invention, the force measurement element is realised by means of an optical sensing element. Preferably, the optical sensing element comprises an optical wave guide structure having one end in proximity with said flexible structure, and having its second end connected with an optical source as well as an interference analysis equipment.

According to a fourth preferred embodiment of the invention, the force measurement element is realised by means of a magnetoelastic sensing element.

Suitably, said indentation tip is also made as a replaceable component, thereby enabling the measurement to be used for different types of measurements.

BRIEF DESCRIPTION OF THE DRAWINGS

The invention will hereinafter be described in closer detail, with reference to the accompanying drawings, in which.

DESCRIPTION OF PREFERRED EMBODIMENTS OF THE INVENTION

Figure 1:
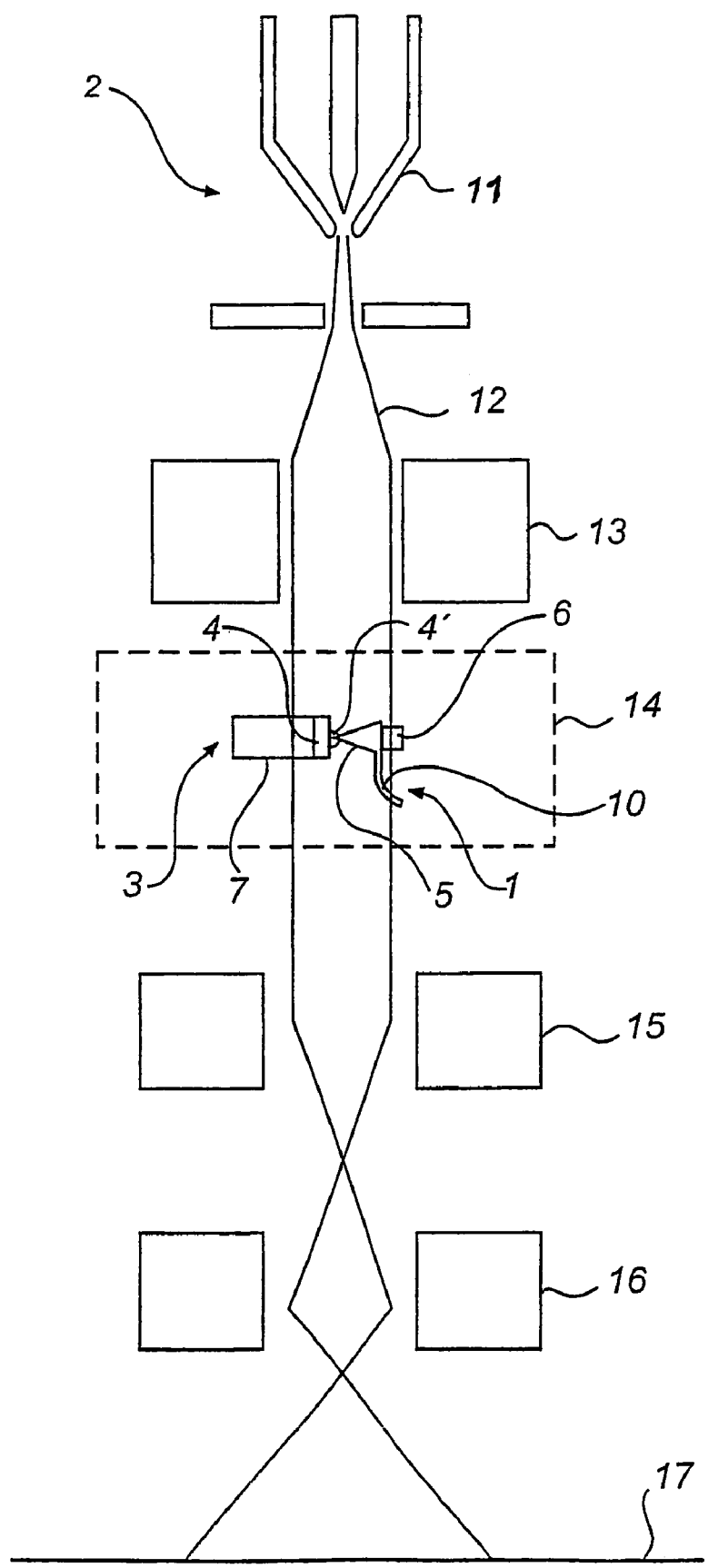
FIG. 1 is a schematic drawing of a transmission electron microscope, in which a measurement device according to the invention is incorporated.

A microscopy structure, in which the measurement device according to the invention may be implemented is disclosed in FIG. 1. The microscopy structure comprises a standard transmission electron microscope, such as a Philips® CM200 Super Twin FEG microscope. The configuration of such a standard transmission electron microscope is shown in FIG. 1. The microscope essentially comprises an electron gun 11, able to produce an electron beam 12. The electron beam passes trough various component such as a condensing lens 13, an object, or measurement insert 14 to be studied, an objective lens 15, a projective lens 16 and is ultimately projected on a screen 17. The function of this microscope is well known, and will not be closer described herein. Moreover, it shall be noted that the structure of the electron microscope per se is not important for the present invention, but the invention may be used with various kinds of electron microscopes, and is not limited to the TEM disclosed in FIG. 1.

In the object position, an measurement insert, or object 14 is positioned, see FIG. 1. The measurement insert may in accordance with the invention comprise one of a AFM measurement device and a nanoindentation measurement device. However, the mechanical structure of the two measurement devices, as well as the surrounding measurement inserts, are similar, and hence, the below description will be aimed towards an nanoindentation insert. The nanoindentation insert 14 comprises a sample holder 3 holding a sample 4 having a material surface in a position where it is subjected to said electron beam 12. In the case of nanoindentation, the sample is preferably formed with a ridge 4' in order to easily provide for multiple measurements. However this is not of prime importance for the invention. As is disclosed in FIG. 2, said sample holder 3 also comprises a micropositioning device 7 for said sample and comprises for this purpose a tube of piezoelectric material for fine adjustments of position of the sample, and may also comprise a motor for coarse adjustments of the position in the z-direction (not shown). Said sample 4 is fastened in one end of said tube. It shall however be noted that alternative positioning devices may be used.

Further, said nanoindentation insert 14 comprises a sharp indentation tip 5, mounted on a flexible structure 10, in this embodiment a cantilever of a resilient material, such as silicon. In the embodiment shown in FIG. 2, the cantilever is mounted on a fixed rod 18, but it may also be mounted on a second micropositioning device (not shown), for enabling an adjustment of the indentation tip position. Alternatively, only the nanoindentation tip may be connected with a micropositioning device, controlling the relative positions of the indentation tip and the sample surface. In the case of nanoindentation, the indentation tip 5 is manufactured from a hard material, such as diamond or the like. The indentation tip 5 is positioned so as to be directed towards said sample, as best seen in FIG. 2.

Figure 6:
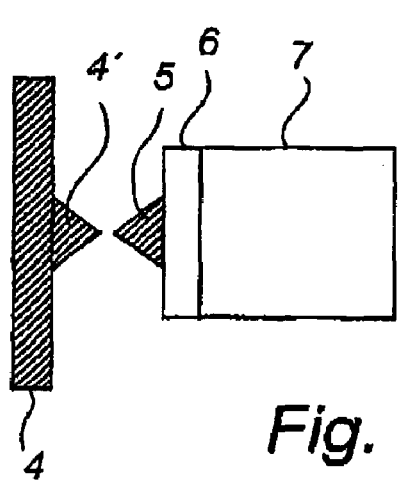
FIG. 6 is a schematic drawing illustrating a first preferred position of the measuring device according to the invention.
Figure 7:
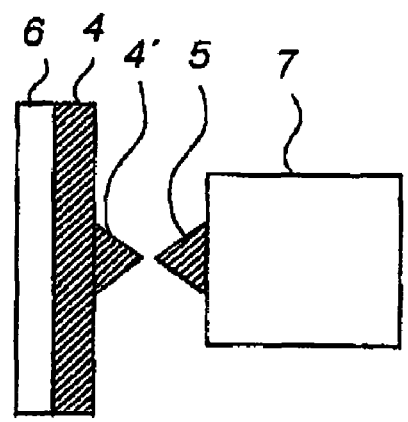
FIG. 7 is a schematic drawing illustrating a second preferred position of the measuring device according to the invention.

In accordance with the invention, a force sensor 6 is positioned in proximity with area of indentation between the sample 4 and the indentation tip 5. This force sensor 6 is arranged to directly measure the force between the tip and the sample, as a result of interaction them between. According to a first embodiment of the invention, the force sensor 6 is arranged together with the sample, as is schematically shown in FIG. 7. It shall be noted that in FIG. 7, the positioning device is arranged to move the indentation tip 5, instead of the sample, as is the case in FIGS. 1 and 2. According to an alternative embodiment, as disclosed in FIGS. 1, 2 and 6, the force sensor 6 is arranged together with the indentation tip 5. Also here it shall be noted that in FIG. 6, the positioning device is arranged to move the indentation tip 5, instead of the sample, as is the case in FIGS. 1 and 2.

Figure 2:
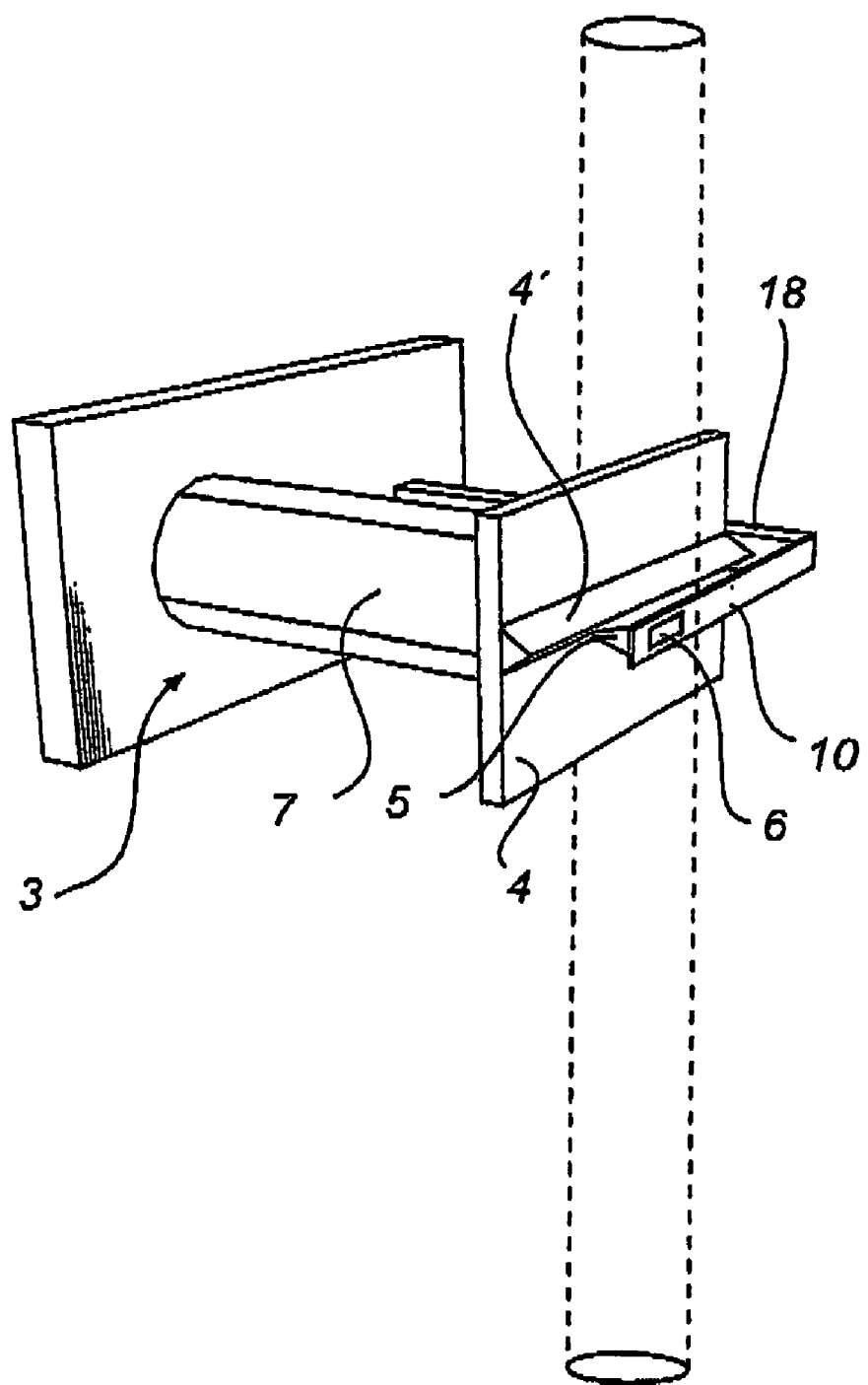
FIG. 2 shows a schematic close-up of a measurement insert for a TEM in accordance with one embodiment of the invention.

Essentially, the force sensor 6 comprises a flexible structure 10, such as a cantilever, as disclosed in FIGS. 1 and 2 or a membrane (as for example disclosed in FIG. 4 that will be closer described below), being in mechanical contact with the tip 5 or the sample 4, so that any forces experienced by the tip 5 or the sample 4 is transferred to said flexible structure 10. The force sensor 6 also comprises a force measurement element 9, being arranged to measure the force applied to the flexible structure 10, and thereby achieve a direct measure of the force resulting from the interaction between the tip 5 and the sample 4. Different ways of achieving the force measurement element 9 will be described below.

The principal operation of the atomic force microscope will now be briefly described. First, the nanoindentation insert is placed in the object position of the TEM, as shown in FIG. 1. It is also possible to have a fixed nanoindentation unit within a TEM. When in the right position the electron beam path of the TEM shall at least cover the area of said indentation tip 5 and a surface area of the sample 4, as shown in FIG. 2. When making a measurement and visualisation, an electron beam is transmitted through the electron microscopy system, thereby passing through the object position, which results in an imaging of the tip and sample area on said screen 17. As seen in FIG. 2, the imaging in this case will be the nanoindentation insert as seen from the side. Simultaneously, the nanoindentation insert measures the force interaction between the sample 4 and the tip 5 by means of said force measurement device 1. The applied force may be changed by moving the sample 4 and the indentation tip 5 in relation to each other by means of said micropositioning device 7 for the sample holder 3 and/or the indentation tip 5. Furthermore, deformation (elastic or plastic) may be studied and followed by TEM imaging.

Figure 3:
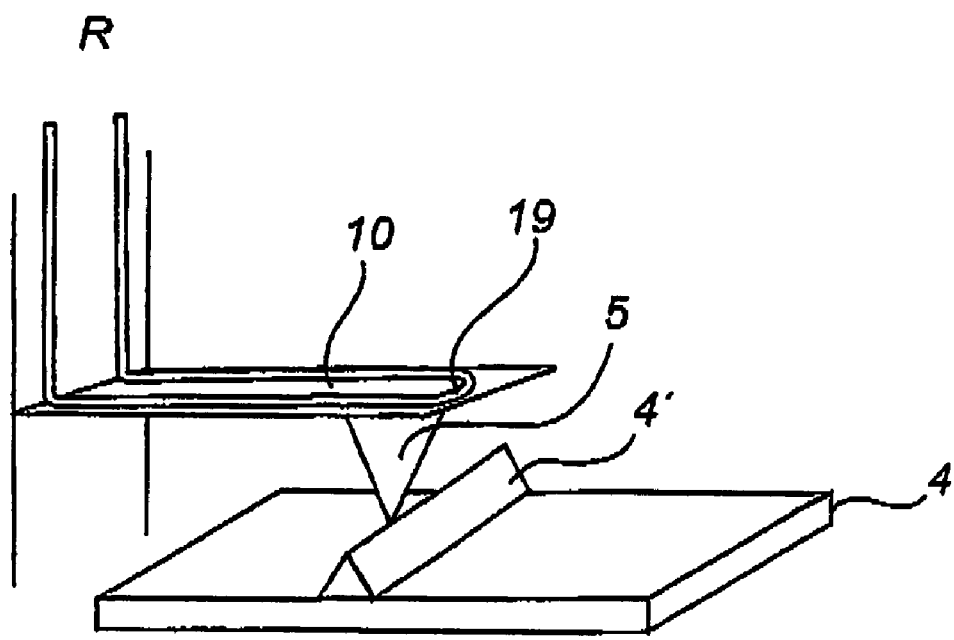
FIG. 3 discloses a schematic drawing of a measurement device according to a first embodiment of this invention.

A first embodiment of the force sensor 6 will hereinafter be described with reference to FIG. 3. In this embodiment, as described above, the force sensor 6 comprises a flexible structure 10, such as a cantilever or a membrane, having a determined force constant. The force measurement element 6 is realised by means of a piezoresistive element 19, being arranged in contact with the flexible structure 10. Thereby, upon movement of the flexible structure due to force interaction between the tip 5 and the sample 4, this will be detected by the piezoresistive element 19, being a measure of the interaction force. Suitably, the piezoresistive element 19 may be realised as a conductor of a piezoelectric material, the conductor being fastened on the surface of the flexible structure, or being integrated with the flexible structure, upon manufacture thereof. A measurement device, for measuring any changes of the piezoresistive element, due to force application, may also be provided (not shown).

Figure 5:
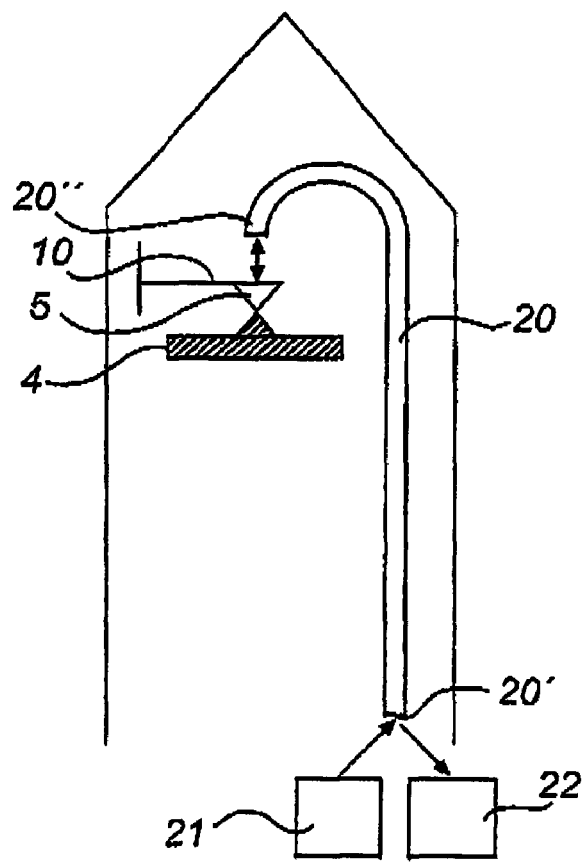
FIG. 5 discloses a schematic cross-section of a probe, comprising a measurement device according to a third embodiment of this invention.

A second embodiment of the force sensor 6 will hereinafter be described with reference to FIG. 5. In this embodiment, an optical wave guide 20, such as an optical fibre is arranged within the measurement device. In one end 20' of the optical wave guide, an optical source 21, as well as an interference analysis equipment 22 is arranged. The other end 20" of the optical waveguide is arranged in proximity with, but on a distance from said flexible structure 10. The arrangement is such that light emitted from said optical wave guide is essentially reflected by said flexible structure 10, and re-entered into the optical wave guide 20. Depending on the distance between the optical wave guide end 20" and the flexible structure 10 as well as on the wavelength of the light generated by the optical source, an interference pattern will be generated by the original light beam and the reflected light beam, the pattern being dependent on the distance between the end 20" of the optical wave guide and the flexible structure 10. Upon movement of the flexible structure due to force interaction between the tip 5 and the sample 4, the distance between the flexible structure 10 and the optical wave guide end 20" is changed, and the change is detected by the interference analysis equipment 22, being a measure of the interaction force.

Figure 4:
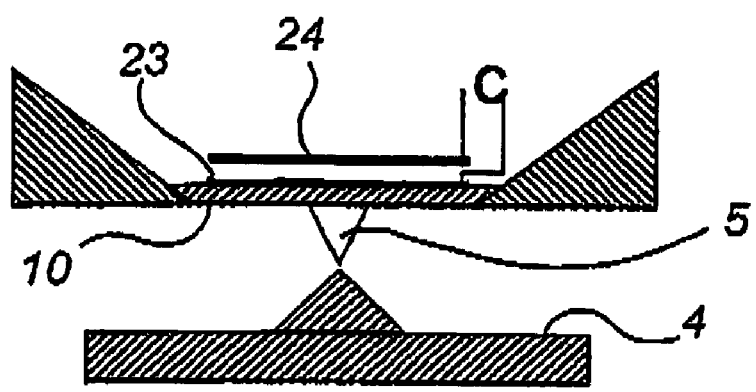
FIG. 4 discloses a schematic cross-section of a measurement device according to a second embodiment of this invention.

A third embodiment of the force sensor 6 will hereinafter be described with reference to FIG. 4. In this embodiment, the flexible structure 10 comprises a membrane. On one side of said membrane, the indention tip 5 is arranged, and on the opposite side, a layer of conductive material is arranged, in order to function as a first electrode 23. The force measurement device comprises a second electrode 24 being arranged on a small distance from the flexible structure 10 and the first electrode 23, the distance being about 0.1-100 μm, preferably about 5-10 μm, being a distance comparatively easy to manufacture, at the same time providing an adequate accuracy. Both electrodes are connected to a common measuring circuit (not shown), the two electrodes together forming a capacitive element. Upon movement of the flexible structure 10 due to force interaction between the tip 5 and the sample 4, the distance between the first and second electrode is changed, and the change is detected by the common measuring circuit, being a measure of the interaction force.

Alternatively, the force sensor may also be realised using a magneto-elastic force measurement element.

In the above-described embodiments of the force sensor 6 according to the invention, high accuracy is of great importance. Therefore, the force sensor 6 may preferably be realised using micro electromechanical system technology (MEMS) or nano electromechanical system technology (NEMS).

Moreover, according to the invention, the indentation tip 5 is made as a replaceable component, so that the tip may be replaced depending on the function needed. For instance, a magnetic tip may be applied if magnetic forces is to be studied. In this way, most scanning probe technologies may be realised using the same measurement system, merely by changing the tip. In the case of nanoindentation, the tip may be replaced in order to provide measurements with different indentation tips, for example having different diamond geometries, or being of different materials, such as diamond and tungsten.

It shall be noted that many further developments of this invention are possible for a man skilled in the art, without departing from the scope of this invention, as defined by the appended claims. For example, as indicated above, in all embodiments described above, the force sensor 6 may be located in various positions in the measurement device. The sensor may be positioned together with the indentation tip (FIG. 6) or together with the sample (FIG. 7). Alternatively, it is possible to put the sample 5 on the positioning device 7, and keep the force sensor fixed. This is indicated by FIG. 7.

It shall also be noted that, although the above described examples are mainly focused on the implementation of the invention for the purpose of providing a nanoindentation measurement device, the device according to the invention may also be used in an integrated atomic force microscope, incorporated in-situ in an electron microscope, such as the device described in the patent document WO 01/63204. The device in accordance with the invention is equally applicable for different modes of AFM operation, such as contact mode, non-contact mode and intermittent mode.

It shall also be noted that the term "indention tip" as used herein shall be held to comprise probe tips of various kinds, both tips that are designed to be in contact with a sample upon measuring and tips that are designed to be positioned at a small distance from the sample upon measuring. Moreover, the term "interaction" as used herein shall be interpreted broad, and is intended to cover any action in which the tip and the sample affect each other, directly or indirectly, by contact or contact-less.

The invention claimed is:

1. A measurement device for use in an electron microscope, the device comprising:
   a sample holder for holding a sample to be studied;
   a nanoindentation tip made of a hard material arranged in proximity of said sample holder;
   a positioning device arranged to bring said tip into contact with and to indent the surface of said sample, whereby an interaction between said sample and said tip is arranged to be measured and directly visualized with said electron microscope; and
   a force sensor, positioned in proximity with an interaction area of said sample and said tip, and arranged to directly measure a force resulting from interaction between said sample and said tip.

2. The device of claim 1, wherein the force sensor is positioned in contact with or in close proximity with said sample.

3. The device of claim 1, wherein the force sensor is positioned in contact with or in close proximity with said tip.

4. The device of claim 1, wherein said force sensor comprises a flexible structure having a determined force constant, and a force-measurement element, connected with said flexible structure, for measuring the force applied on said flexible structure.

5. The device of claim 4, wherein one of said tip and said sample is arranged on said flexible structure.

6. The device of claim 4, wherein the force-measurement element is realised using a capacitive sensing element.

7. The device of claim 6, wherein said capacitive sensing element comprises a first electrode, arranged on said flexible structure, and a second electrode, arranged at a distance from said first electrode, said first and second electrodes together forming a capacitive element.

8. The device of claim 4, wherein the force-measurement element is realised using a piezoresistive sensing element that is either arranged on or integrated with said flexible structure.

9. The device of claim 4, wherein the force-measurement element is realised using an optical sensing element.

10. The device of claim 9, wherein the optical sensing element comprises an optical wave guide structure having a first end in proximity with said flexible structure, and having a second end connected with an optical source and interference analysis equipment.

11. The device of claim 1, wherein the electron microscope is a transmission electron microscope (TEM).

12. The device of claim 1, wherein the electron microscope is a scanning electron microscope (SEM).

13. A measurement device for use in an electron microscope, the device comprising:

a sample holder for holding a sample to be studied;

an indentation tip arranged in proximity of said sample holder, whereby an interaction between said sample and said tip is arranged to be measured and directly visualized with said electron microscope; and a force sensor positioned in proximity with an interaction area of said sample and said tip, and arranged to directly measure a force resulting from interaction between said sample and said tip, said force sensor comprising a flexible structure having a determined force constant, and a capacitive sensing element, connected with said flexible structure for measuring the force applied on said flexible structure;

wherein said tip is made as a replaceable component.

14. The device of claim 13, wherein one of said tip and said sample is arranged on said flexible structure.

15. The device of claim 13, wherein said capacitive sensing element comprises a first electrode, arranged on said flexible structure, and a second electrode, arranged at a distance from said first electrode, said first and second electrodes together forming a capacitive element.

16. The device of claim 13, wherein the electron microscope is a transmission electron microscope (TEM).

17. The device of claim 13, wherein the electron microscope is a scanning electron microscope (SEM).

* * * * *